United States Patent
Bo

(10) Patent No.: US 7,855,538 B2
(45) Date of Patent: *Dec. 21, 2010

(54) METHOD FOR CURRENT SENSING IN SWITCHED DC-TO-DC CONVERTERS

(75) Inventor: Gian Marco Bo, Savona (IT)

(73) Assignee: Atmel Corporation, San Jose, CA (US)

( * ) Notice: Subject to any disclaimer, the term of this patent is extended or adjusted under 35 U.S.C. 154(b) by 257 days.

This patent is subject to a terminal disclaimer.

(21) Appl. No.: 12/123,311

(22) Filed: May 19, 2008

(65) Prior Publication Data

US 2008/0218152 A1     Sep. 11, 2008

Related U.S. Application Data

(63) Continuation of application No. 11/330,883, filed on Jan. 11, 2006, now Pat. No. 7,375,503.

(51) Int. Cl.
*G05F 1/40* (2006.01)
(52) U.S. Cl. .................. 323/282; 323/299; 323/288
(58) Field of Classification Search ............ 323/282, 323/284, 286, 288, 299
See application file for complete search history.

(56) References Cited

U.S. PATENT DOCUMENTS

| | | | |
|---|---|---|---|
| 4,682,081 A | 7/1987 | Sikora | |
| 5,028,861 A | 7/1991 | Pace et al. | |
| 6,466,188 B1 | 10/2002 | Cato | |
| 6,744,224 B2 * | 6/2004 | Ishii | 315/291 |
| 7,095,215 B2 * | 8/2006 | Liu et al. | 323/222 |
| 7,375,503 B2 * | 5/2008 | Bo | 323/282 |
| 2003/0107358 A1 | 6/2003 | Isham | |
| 2003/0111984 A1 | 6/2003 | Isham | |
| 2005/0127888 A1 | 6/2005 | Marschalkowski et al. | |
| 2007/0159149 A1 | 7/2007 | Bo | |

* cited by examiner

*Primary Examiner*—Jessica Han
(74) *Attorney, Agent, or Firm*—Schwegman, Lundberg & Woessner, P.A.

(57) ABSTRACT

A method for sensing the supply current of a switched DC-to-DC converter is discussed. The method sensing a first voltage that is proportional to the supply current, wherein the first voltage has first noise; outputting a second voltage that is based on the first voltage, and wherein the second voltage has second noise that is smaller than the first noise; and comparing the second voltage to a reference voltage to provide an indication of the supply current. According to the systems and methods disclosed herein, accurate current sensing is provided.

5 Claims, 6 Drawing Sheets

METHOD FOR CURRENT SENSING IN SWITCHED DC-TO-DC CONVERTERS

This application is a Continuation of U.S. application Ser. No. 11/330,883, filed Jan. 11, 2006, now U.S. Pat. No. 7,375,503 which is incorporated herein by reference.

FIELD OF THE INVENTION

The present invention relates to electronic circuits, and more particularly to a system for sensing the supply current, for example in a switched DC-to-DC converter.

BACKGROUND OF THE INVENTION

DC-to-DC converters are well known. A DC-to-DC converter is a device that receives a DC input voltage and produces a DC output voltage. The output voltage is typically produced at a different voltage level from the input voltage. DC-to-DC converters can produce high voltage usable for low power applications including supplying power to mobile devices such as cellular phones and laptop computers.

Sensing supply current is one task that a DC-to-DC converter performs during a voltage conversion process. Supply current sensing in a DC-to-DC converter is generally implemented by sensing the voltage generated by the supply current flowing through a sense resistor. Sometimes the voltage across a switch is directly sensed where the "on" resistance of the switch is used as a sense resistor. Because the sense voltage is based on the supply current, the behavior of the supply current (e.g., glitches) will be reflected in the behavior of the sense voltage. This is problematic, because the resulting sense voltage may be very noisy (i.e., having a high ripple). As a result, current sensing of the conventional DC-to-DC converter is performed with poor accuracy.

Accordingly, what is needed is an improved system for sensing the supply current of a switched DC-to-DC converter. The present invention addresses such a need.

SUMMARY OF THE INVENTION

A system for sensing the supply current of a switched DC-to-DC converter is disclosed. The system includes a first circuit that senses a first voltage that is proportional to the supply current, wherein the first voltage has first ripple; a second circuit coupled to the first circuit, wherein the second circuit outputs a second voltage that is based on the first voltage, and wherein the second voltage has a second ripple that is smaller than the first ripple; and a third circuit coupled to the second circuit, wherein the third circuit compares the second voltage to a reference voltage to provide an indication of the supply current.

According to the system disclosed herein, the system provides accurate current sensing.

DETAILED DESCRIPTION OF THE INVENTION

The present invention relates to electronic circuits, and more particularly to a system for sensing the supply current of a switched DC-to-DC converter. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

A system in accordance with the present invention for sensing the supply current of a switched DC-to-DC converter is disclosed. The system includes a first circuit that senses a sense voltage, which is proportional to the supply current. The sense voltage has ripple that may be relatively high. The system also includes a second circuit that outputs a second voltage that is based on the sense voltage, where the second voltage has a ripple that is substantially smaller than the ripple of the sense voltage. The system also includes a third circuit that compares the second voltage to a reference voltage to provide an indication of the supply current. Because the second voltage has a smaller ripple than that of the sense voltage, the circuit can sense the supply current with better accuracy. To more particularly describe the features of the present invention, refer now to the following description in conjunction with the accompanying figures.

Although the present invention disclosed herein is described in the context of switch DC-to-DC converters, the present invention may apply to types of converters, and still remain within the spirit and scope of the present invention.

Figure 1:
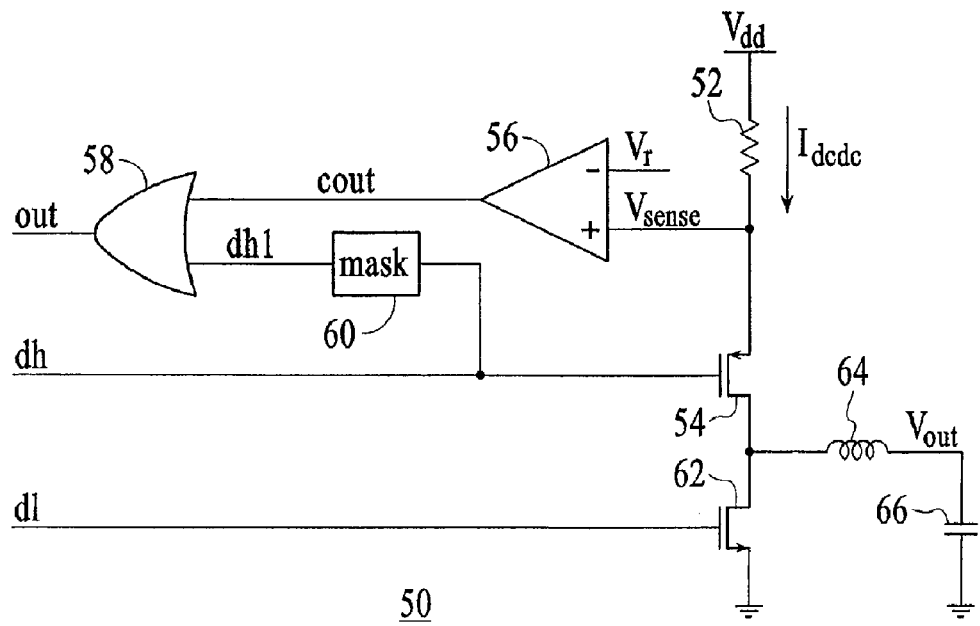
FIG. 1 is a block diagram of a conventional buck DC-to-DC converter where current sensing is performed using a sense resistor in series with a switch.
Figure 2:
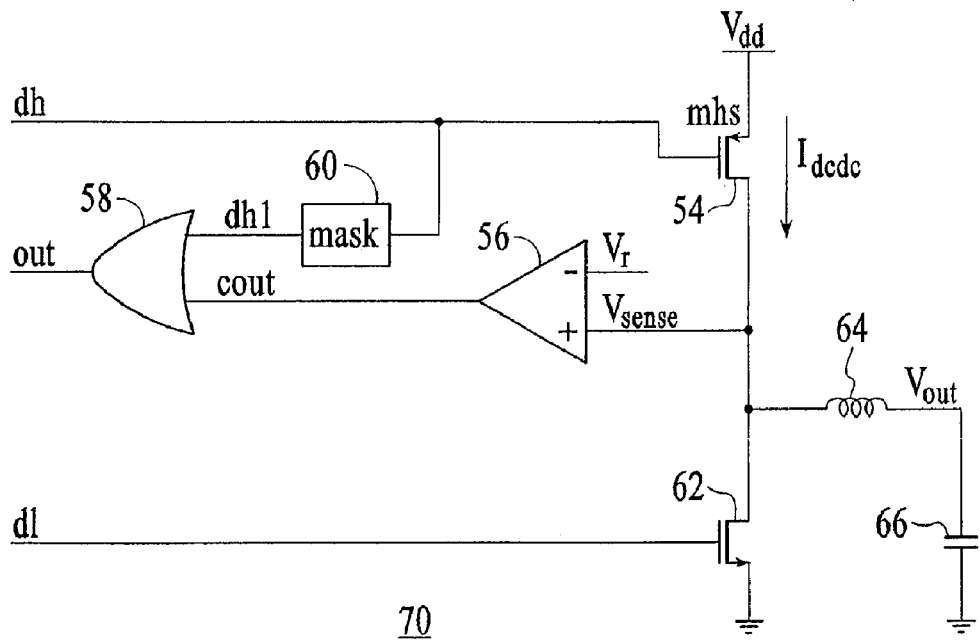
FIG. 2 is a block diagram of the conventional buck DC-to-DC converter similar to the DC-to-DC converter of FIG. 1, except that the current sensing is performed using an "on" resistance of a switch.

FIG. 1 is a block diagram of a conventional buck DC-to-DC converter 50 where current sensing is performed using a sense resistor 52 in series with a switch 54. The DC-to-DC converter 50 also includes a comparator 56, an OR gate 58, a delay block 60, a switch 62, an inductor 64, and a capacitor 66. FIG. 2 is a block diagram of the conventional buck DC-to-DC converter 70 similar to the DC-to-DC converter 50 of FIG. 1, except that the current sensing is performed using an "on" resistance of the switch 54. With both DC-to-DC converters 50 and 70, a sense voltage $V_{sense}$ is compared to a pre-defined reference voltage $V_r$. The reference voltage $V_r$ may represent, for example, the maximum current allowed to flow through the switch 54.

Figure 3:
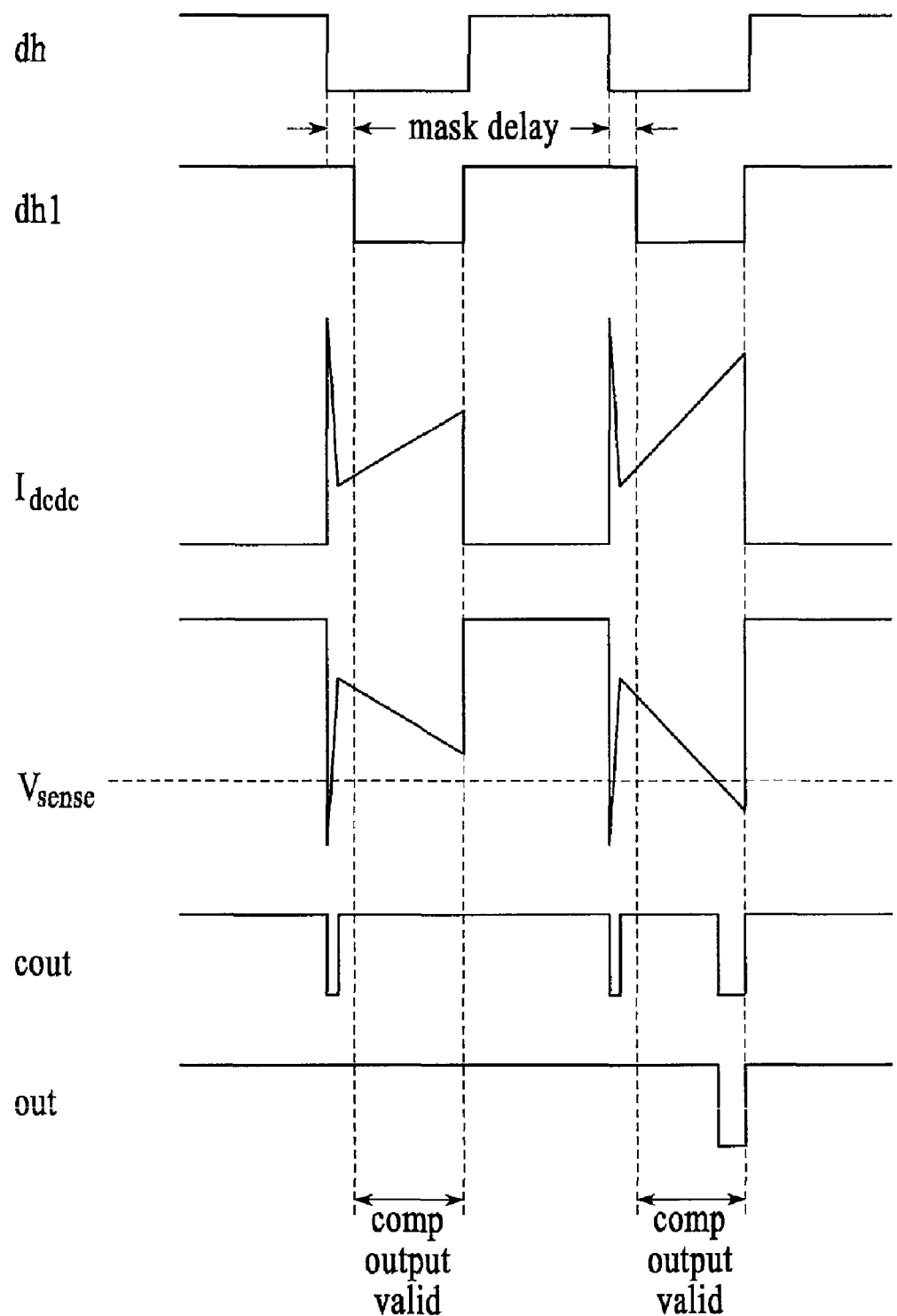
FIG. 3 shows the behavior of the current sensing performed by the DC-to-DC converter of FIG. 1.

FIG. 3 shows the behavior of the current sensing performed by the DC-to-DC converter 50 of FIG. 1. Referring to both FIGS. 1 and 3 together, the two switches 54 and 62 alternatively turn on and off such that the signals dh and dl behave like a two-phase clock signal, the duty cycle of which defines the value of the DC-to-DC converter output voltage $V_{out}$. The switch 54 is controlled by the signal dh. Accordingly, when the signal dh is low, the switch 54 turns on, and the supply current $I_{dcdc}$ flows from the voltage supply $V_{dd}$ to the output voltage $V_{out}$. The sense resistor 52 is connected between the voltage supply $V_{dd}$ and the switch 54. When the switch 54 is on, the supply current $I_{dcdc}$ flows through the resistor 52 and generates a sense voltage $V_{sense}$, which is proportional to and thus represents a measure of the supply current $I_{dcdc}$. When the switch 54 is off, no current flows through the resistor 52 (i.e., $I_{dcdc}=0$) and the sense voltage $V_{sense}$ is equal to the supply voltage $V_{dd}$. By comparing the sense voltage $V_{sense}$ with a proper reference voltage $V_r$, the output is only valid when the switch 54 is on. That is, the output of the DC-to-DC converter 50 must be gated with the same signal used to turn on the switch 54; i.e., the output of the DC-to-DC converter 50 must be ORed with the signal dh. A problem with the DC-to-DC converter 50 is that glitches can occur in the current due to direct path current (i.e., non-ideal switching of the switches 54 and 62) as well as in the sense voltage $V_{sense}$. Consequently, the output of the comparator can change state, even if the current threshold determined by the voltage $V_r$ is not reached. This is shown in FIG. 3 where glitches on the supply current $I_{dcdc}$ generate glitches on the sense voltage $V_{sense}$, which makes the output of the DC-to-DC converter 50 change state. To avoid this behavior, the OR gate 58 is controlled by signal dh1 instead of signal dh. Signal dh1 (generated through delay block 60) has a delayed falling edge with respect to dh, and thus, as shown in FIG. 3, the comparator changes its state only if the sense voltage $V_{sense}$ becomes lower than the threshold $V_r$. Glitches have no effect on the comparator output.

The DC-to-DC converter 70 of FIG. 2, where the current sensing is performed by sensing the voltage drop across switch 54, has the same problems as the DC-to-DC converter 50 of FIG. 1. The problem with the DC-to-DC converters 50 and 70 is that the sense voltage elements have a very high ripple, as shown in FIG. 3. Consequently, this makes it difficult to perform accurate current sensing. Assuming, for example, that the current threshold at 1 A and the sense resistor 52 0.1Ω, the ripple voltage is about 100 mV. Both circuits of FIGS. 1 and 2 have this problem.

In accordance with the present invention, a DC-to-DC converter senses DC-to-DC current by sensing the voltage drop across a sense resistor or across a switch by providing to the comparator a clean sense voltage $V_{sense}$ (i.e., a sense voltage with a very small ripple).

Figure 4:
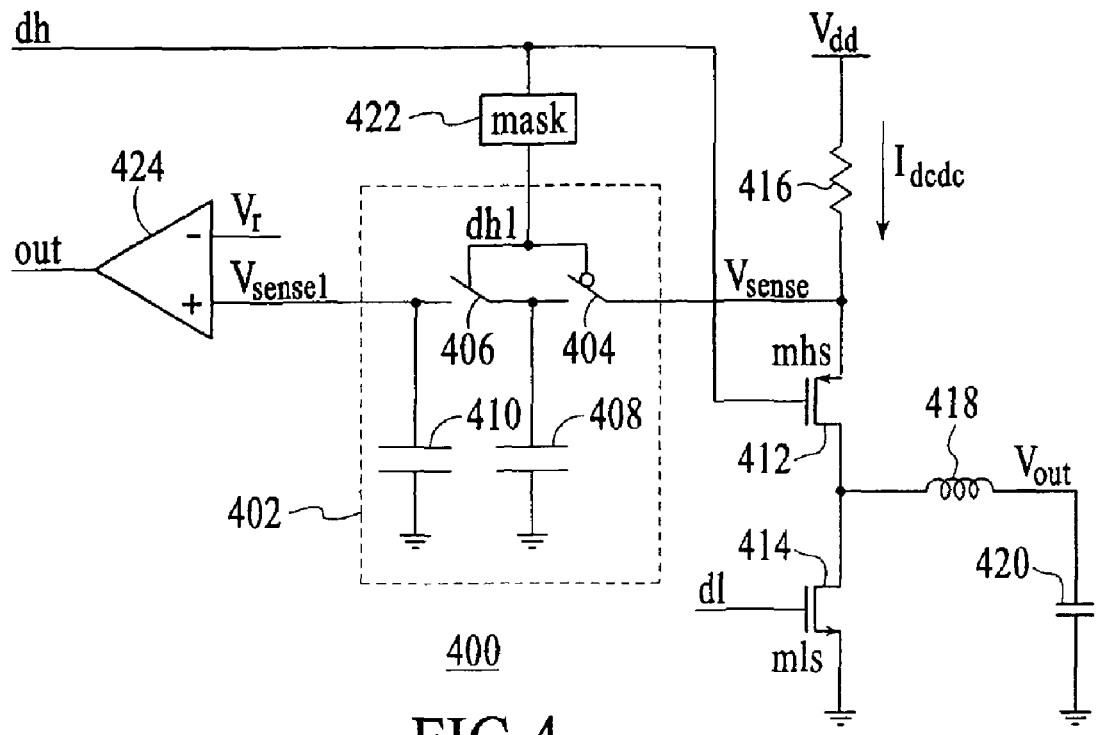
FIG. 4 is a schematic diagram of a DC-to-DC converter in accordance with one embodiment of the present invention.

FIG. 4 is a schematic diagram of a DC-to-DC converter 400 in accordance with one embodiment of the present invention. The DC-to-DC converter 400 includes a switched capacitor circuit 402 that has switches 404 and 406 and capacitors 408 and 410. The DC-to-DC converter 400 also includes switches 412 and 414, a sense resistor 416, an inductor 418, a capacitor 420, a delay block 422, and a comparator 424. In one embodiment, the switches 412 and 414 are PMOS and NMOS transistors, respectively.

In operation, the supply current $I_{dcdc}$ of the DC-to-DC converter 70 is sensed through the sense resistor 416. The switches 412 and 414 and the sense resistor 416 sense the sense voltage $V_{sense}$, which is proportional to and thus representative of the supply current $I_{dcdc}$. The sense voltage $V_{sense}$ is input to the switched capacitor circuit 402, which generates voltage $V_{sense1}$ that is used as input for the comparator 424. The voltage $V_{sense1}$ has a very small ripple. A signal dh1 controls the switches 404 and 406. The signal dh1 is used instead of dh in order to avoid glitches on the sense voltage $V_{sense}$.

When the switch 412 turns on, the switch 404 closes and the switch 404 opens. The capacitor 408 is then charged such that the capacitor 408 stores a charge that has a voltage that matches the sense voltage $V_{sense}$. The capacitor 410 remains floating, making voltage $V_{sense1}$ constant. The input resistance of the comparator 424 is assumed to be infinite. When the switch 412 turns off, the switch 404 opens and the switch 406 closes. When the switch 406 closes, the capacitors 408 and 410 share their charges. In other words, the capacitor 408 charges the capacitor 410 such that the capacitor 410 stores a voltage that matches the sense voltage $V_{sense}$, thereby biasing the voltage $V_{sense1}$ such that the voltage $V_{sense1}$ is based on the sense voltage $V_{sense}$ and thus reflects or represents the supply current $I_{dcdc}$. The voltage $V_{sense1}$ then represents the current $I_{dcdc}$ flowing from the supply. Accordingly, when the load current changes, the voltages $V_{sense}$ and $V_{sense1}$ change as well. The transmit time depends on the ratio between the values of the capacitors 408 and 410.

In accordance with the present invention, due to the charge sharing aspect of the capacitors 408 and 410, high values of the capacitor 410 relative to the capacitor 408 allow only a very small ripple on the voltage $V_{sense1}$ but increase the transient time with respect to a load variation. The size of the switches and capacitors are optimized to minimize charge injection effects and to minimize the ripple on the voltage $V_{sense1}$. As a result, the fixed load condition is very small, thus allowing accurate current sensing.

The comparator 424 compares the voltage $V_{sense1}$ to the reference voltage $V_r$, representing a threshold value of the supply current. The threshold value may be, for example, the maximum supply current allowed to flow through the switch 412. Accordingly, comparing the voltage $V_{sense1}$ to the reference voltage $V_r$ provides an indication of the supply current $I_{dcdc}$ (e.g., whether the supply current $I_{dcdc}$ is above or below a threshold current represented by the reference voltage $V_r$).

Figure 5:
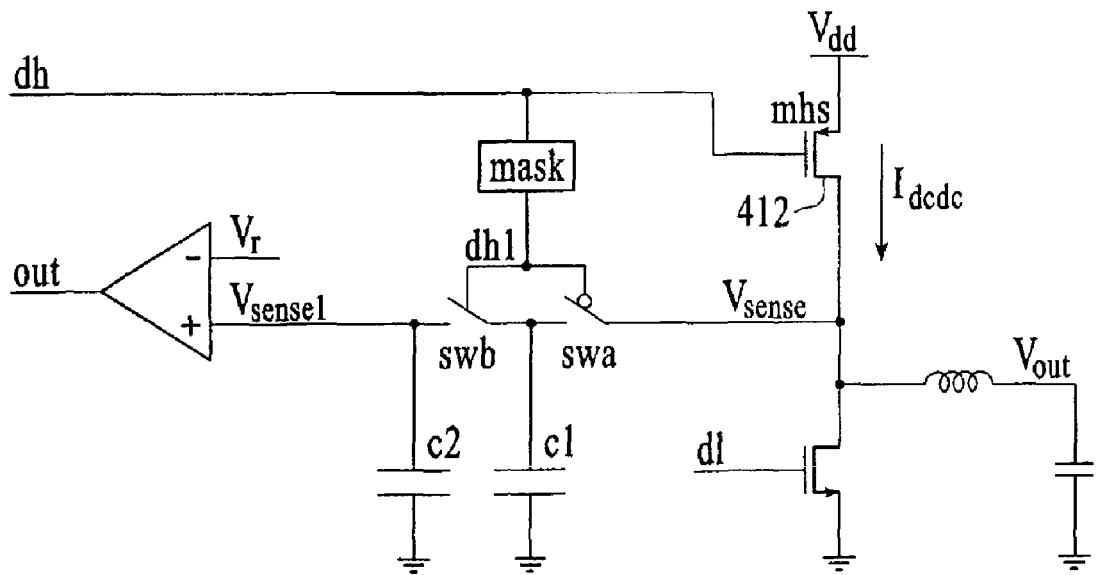
FIG. 5 is a schematic diagram of a DC-to-DC converter in accordance with another embodiment of the present invention.

FIG. 5 is a schematic diagram of a DC-to-DC converter 500 in accordance with another embodiment of the present invention. The DC-to-DC converter 500 is similar to the DC-to-DC converter 400 of FIG. 4, except that in the DC-to-DC converter 500, the DC-to-DC current $I_{dcdc}$ is sensed through an "on" resistance of the switch 412. In operation, the DC-to-DC converter 500 functions similarly to the DC-to-DC converter 400.

Figure 6:
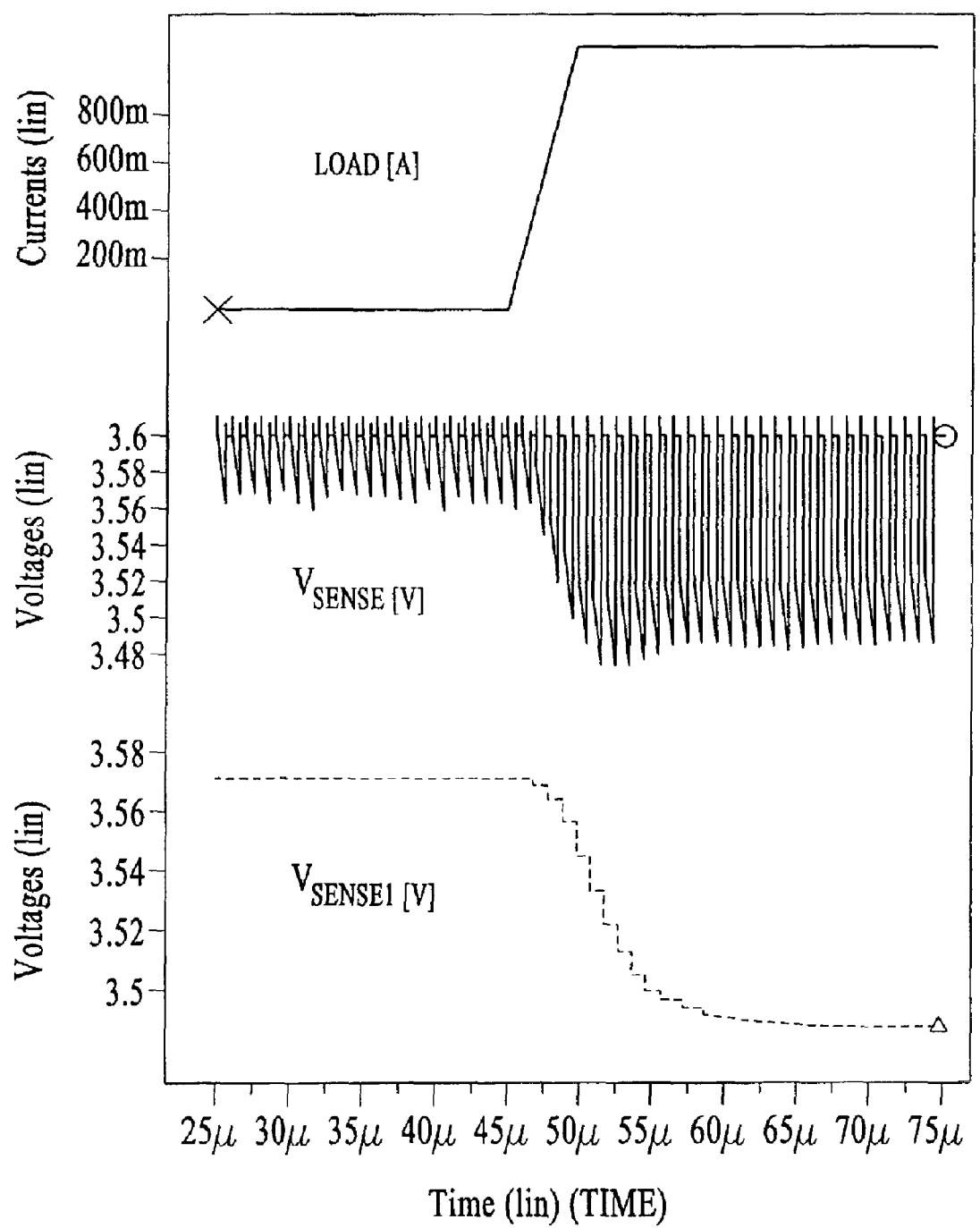
FIG. 6 shows the behavior of voltages $V_{sense1}$ and $V_{sense1}$ for the DC-to-DC converter shown in FIG. 4 when the DC-to-DC load is changed from 100 mA to 1 A, in accordance with the present invention.

FIG. 6 shows the behavior of voltages $V_{sense}$ and $V_{sense1}$ for the DC-to-DC converter 400 shown in FIG. 4 when the DC-to-DC load is changed from 100 mA to 1 A, in accordance with the present invention. This has been obtained by using C1=0.25 pF and C2=1 pF. Note that the sense voltage $V_{sense}$ has very high ripple (i.e., more than 100 mV) compared to the very small ripple of the voltage $V_{sense1}$ (i.e., a few mV). Because this ripple is very small, current sensing can be performed with more accuracy.

Figure 7:
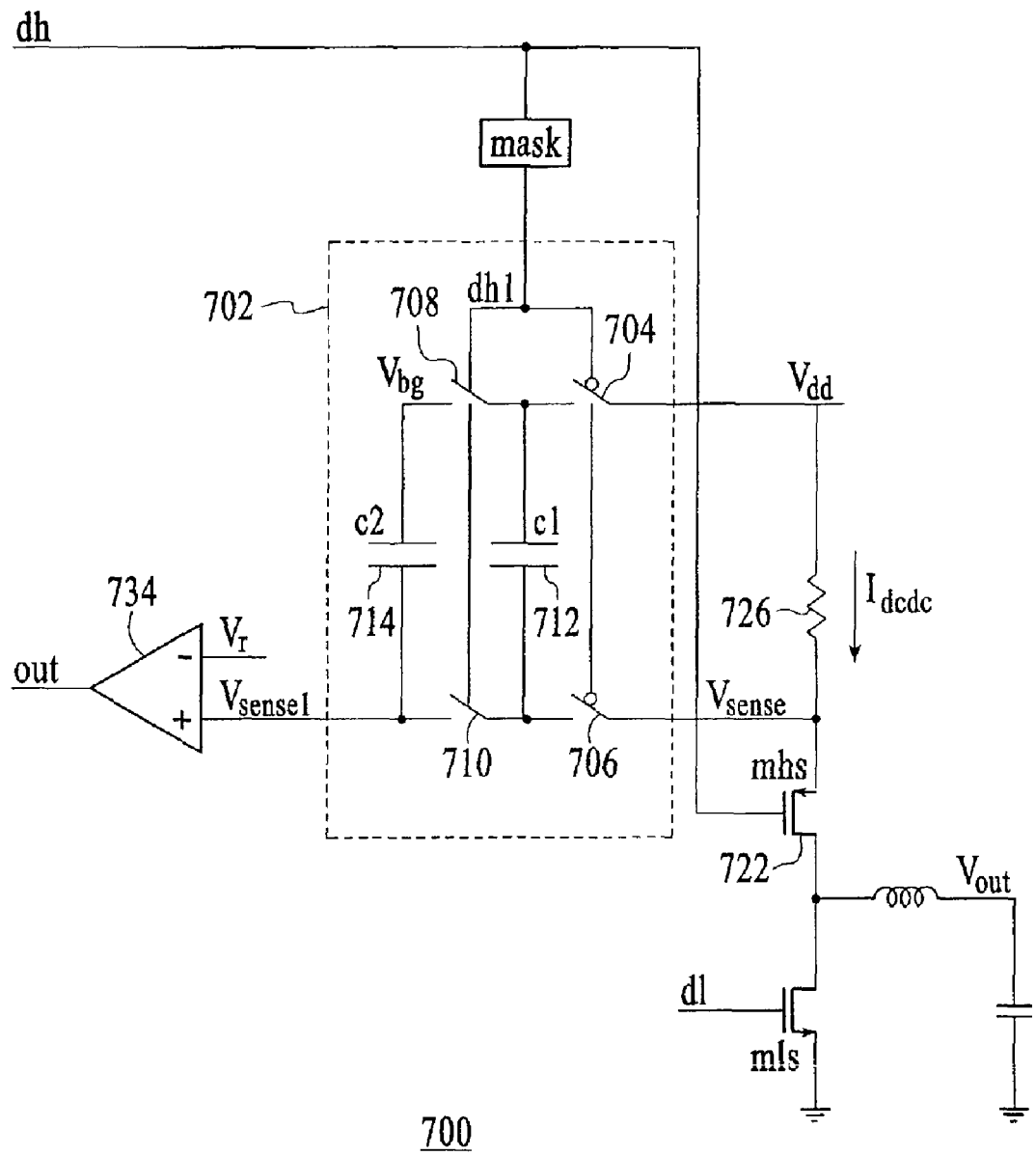
FIG. 7 is a schematic diagram of a DC-to-DC converter in accordance with another embodiment of the present invention.

FIG. 7 is a schematic diagram of a DC-to-DC converter 700 in accordance with another embodiment of the present invention. The DC-to-DC converter 700 is similar to the DC-to-DC converter 400 of FIG. 5, except for the switched capacitor circuit 702. The switched capacitor circuit 702 of the DC-to-DC converter 700 includes switches 704, 706, 708, and 710, and includes capacitors 712 and 714. Also, one node of the capacitor 712 is connected to $V_{dd}$ (instead of to ground), and one node of the capacitor 714 is connected to a reference bandgap voltage $V_{bg}$ (instead of to ground).

Referring briefly to FIG. 4, if the supply current $I_{dcdc}$ to be sensed is very low, the voltage $V_{sense1}$ will be slightly below the supply voltage $V_{dd}$. If the value of the sense resistor 416 is 0.1Ω and the current $I_{dcdc}$ to be sensed is 100 mA, the voltage $V_{sense1}$ will be about 10 mV below the supply voltage $V_{dd}$, and the comparator 424 can thus work with a very-high-input common-mode voltage.

Referring again to FIG. 7, the DC-to-DC converter 700 allows a change of the common-mode voltage of the voltage $V_{sense1}$. When the switch 722 turns on, the capacitor 712 is charged to the voltage across the resistor 726. When the switch 722 turns off, the capacitor 712 shares its charge with the capacitor 714, which has one node connected to the bandgap voltage $V_{bg}$. Assuming that the sense resistor 726=0.1Ω, the bandgap voltage $V_{bg}$=1.2V, and the supply current $I_{dcdc}$ to be sensed is 100 mA, the resulting voltage $V_{sense1}$ will be 10 mV below the bandgap voltage $V_{bg}$ (i.e., 1.19V). This means that the comparator 734 operates with a good common-mode input voltage relative to the DC-to-DC converters 400 and 500 of FIGS. 4 and 5, respectively.

In an alternative embodiment, a ratiometric common-mode voltage can be used instead of the bandgap voltage $V_{bg}$. This would guaranty that the DC-to-DC comparator 734 operates with its best common mode input voltage, thus minimizing the input offset.

Figure 8:
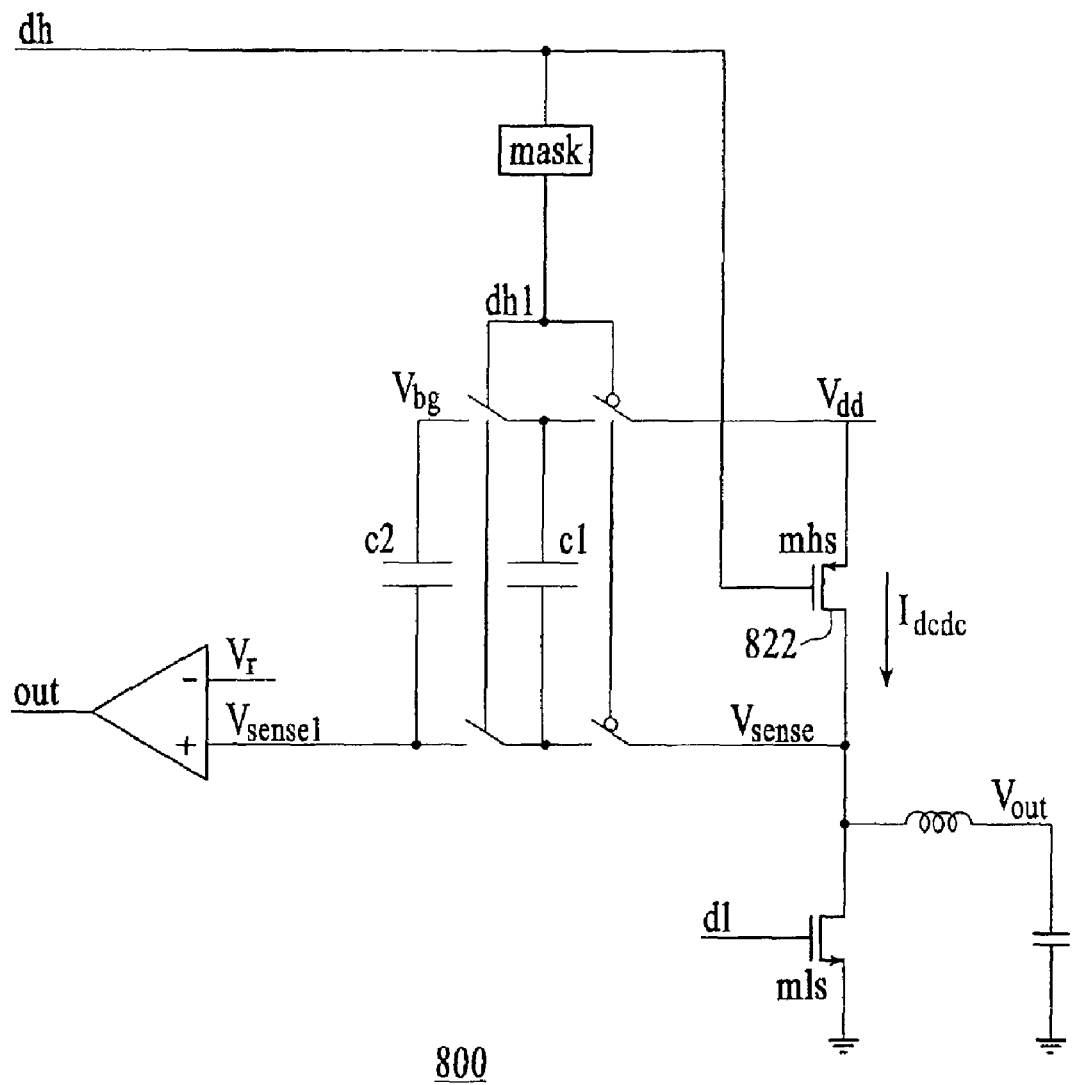
FIG. 8 is a schematic diagram of a DC-to-DC converter 800 in accordance with another embodiment of the present invention.

FIG. 8 is a schematic diagram of a DC-to-DC converter 800 in accordance with another embodiment of the present invention. The DC-to-DC converter 800 is similar to the DC-to-DC converter 700 of FIG. 7, except that in the DC-to-DC converter 800, the DC-to-DC current $I_{dcdc}$ is sensed through an "on" resistance of the switch 822.

According to the system disclosed herein, the present invention provides numerous benefits. For example, it provides accurate current sensing with low current overhead.

A system in accordance with the present invention for sensing the supply current of a switched DC-to-DC converter has been disclosed. The system includes a first circuit that senses a sense voltage, which is proportional to the supply current. The sense voltage has ripple that may be relatively high. The system also includes a second circuit that outputs a second voltage that is based on the sense voltage, where the second voltage has a ripple that is substantially smaller than the ripple of the sense voltage. The system also includes a third circuit that compares the second voltage to a reference voltage to provide an indication of the supply current. Because the second voltage has a smaller ripple than that of the sense voltage, the system can sense the supply current with better accuracy.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A method for sensing a supply current, comprising:
   sensing a first voltage that is proportional to the supply current and includes first noise, wherein sensing the first voltage includes controlling a switched capacitor circuit using a delay signal;
   outputting a second voltage that is based on the first voltage and includes second noise that is smaller than the first noise, wherein outputting the second voltage includes switching a first switch to charge a first capacitor and switching a second switch to charge a second capacitor based on the delay signal, and wherein the delay signal operates to correct for a transit delay between the first capacitor and the second capacitor; and
   comparing the second voltage to a reference voltage to provide an indication of the supply current.

2. The method of claim 1, wherein outputting a second voltage includes, during a first phase, storing a first charge having a first charge voltage based on the first voltage.

3. The method of claim 2, wherein outputting a second voltage includes, during a second phase, storing a second charge having a second charge voltage based on the first charge voltage.

4. The method of claim 1, wherein switching the first switch includes closing the first switch only when the second switch is open.

5. The method of claim 1, wherein outputting a second voltage includes switching a first switch to charge a first capacitor and switching a second switch to charge a second capacitor.

* * * * *